United States Patent [19]

Kraft et al.

[11] Patent Number: 4,803,398

[45] Date of Patent: Feb. 7, 1989

[54] ELECTRON GUN WITH ONE DIRECTLY HEATABLE AND ONE INDIRECTLY HEATABLE CATHODE

[75] Inventors: Reinhardt Kraft, Altenstadt; Horst Ranke, Alzenau, both of Fed. Rep. of Germany

[73] Assignee: Leybold-Heraeus GmbH, Cologne, Fed. Rep. of Germany

[21] Appl. No.: 881,709

[22] Filed: Jul. 3, 1986

[30] Foreign Application Priority Data

Sep. 30, 1985 [DE] Fed. Rep. of Germany ....... 3534792

[51] Int. Cl.[4] .................................................. H01J 1/20
[52] U.S. Cl. .................................... 313/337; 313/237; 313/238
[58] Field of Search ................ 313/237, 238, 337, 251, 313/261, 285, 286, 446, 447

[56] References Cited

U.S. PATENT DOCUMENTS 2,277,024 3/1942 Ruska et al. ......................... 313/237
3,187,216 6/1965 Sciaky ................................. 313/237
3,273,003 2/1963 Dietrich .
4,057,746 11/1977 Dumont .............................. 313/237
4,082,937 4/1978 Istomin et al. .................. 313/237 X

FOREIGN PATENT DOCUMENTS 2627862 1/1977 Fed. Rep. of Germany .

Primary Examiner—David K. Moore
Assistant Examiner—Michael Razavi
Attorney, Agent, or Firm—Felfe & Lynch

[57] ABSTRACT

An electron gun with one directly heatable initial cathode (2), one indirectly heatable second blocking cathode (3) and one focusing electrode (17). The focusing electrode (17) presents an initial centering region (18) and, by means of supporting braces, the blocking cathode (3) is fixed concentrically in a carrier ring (19) presenting a second centering region complementary to the first centering region (18). This permits the blocking cathode (3) to be introduced into the focusing electrode from the back by means of the carrier ring (19), and the carrier ring (19) is secured by means of a locking ring (24).

3 Claims, 2 Drawing Sheets

ELECTRON GUN WITH ONE DIRECTLY HEATABLE AND ONE INDIRECTLY HEATABLE CATHODE

BACKGROUND OF THE INVENTION

This invention relates to an electron gun with one directly heatable initial cathode mounted behind an indirectly heatable second blocking cathode which, across several offset supporting braces, is connected with a centrally drilled discoid component of a focusing electrode.

Electron guns of this type are used as sources of high energy electron beams such as those required for vacuum fusion and/or volatilization of materials. For such purposes the blocking cathode consisting essentially of a solid circular disk is generally heated up by a directly heated spirally coiled-wire/cathode which then in its turn emits a focused beam of electrons based on an accelerator potential existing within the system.

U.S. Pat. No. 3,273,003 discloses various forms of a known indirectly heatable blocking cathode, but indicates that the loose ends of the offset supporting braces are connected by a conventional retaining device. The prior art teaches beveling the loose ends of the offset supporting braces and introducing them under grid potential into paraxial clearance holes of a discoid component. This discoid component is coupled by rivets to the front flange of a tubular element. The discoid and the tubular parts thus together constitute a focusing electrode, also frequently termed a Wehnelt cylinder.

The known design, however, entailed the following problems : Beveling of the supporting braces was comparatively difficult and could not always be effected with the required precision and even the non-positive mounting in the paraxial clearance holes led only, after protracted laborious adjustment, to a somewhat approximate coaxial alignment to a central bore in the discoid component. Coaxial alignment is, nevertheless, an important matter since the specific beam: formation is determined by the geometric shape of the center bore. The riveting described above caused an aberration in the surface of the focusing electrode that led to objectionable peak voltages with locally excessive field strengths. Occasionally also, the varying lengths of beveled ends of supporting braces that project from the front of the focusing electrode resulted in additional peak voltages. These peak voltages promoted flashovers which must be avoided as far as possible in vacuum plants.

Also, the blocking cathode as well as the discoid component of the focusing electrode are exposed to a not insignificant amount of wear and tear conditioned by the charge and, further, if the electron gun has to be retooled, the blocking cathode and the discoid component must be replaced. In both cases the rivets previously mentioned must be reamed out. This drilling process is permissibile only a few times before the parts in question become unserviceable.

SUMMARY OF THE INVENTION

The underlying task of this invention is, therefore, to provide an electron gun as specified at the outset, in which the blocking cathode can be adjusted accurately to the discoid component while replacement of the blocking cathode and discoid component remains reasonably simple in each case and where no kind of surface aberrations can appear on the surface of the focussing electrode.

According to the invention, the solution of the above task results from the fact that (a) the discoid component presents an initial centering region that is aligned concentrically to the bore;

(b) the blocking cathode is attached concentrically by its supporting braces in a carrier ring which itself presents a second centering region complementary to the first centering region;

(c) the blocking cathode is introduced into the discoid component from the back by means of the carrier ring, and that (d) the carrier ring and the discoid component are gripped tightly against each other by means of a locking ring.

In such an electron gun the blocking cathode as well as the discoid component can be dismantled toward the interior of the focusing electrode only by loosening the locking ring. The blocking cathode can be positioned with extraordinary accuracy relative to the carrier ring by means of its supporting braces, using a gauge if necessary, so that the assembly consisting of the blocking cathode, supporting braces and carrier ring is adjustable with the utmost precision on insertion into the discoid component. This way, perfect electrical connection is also possible between the supporting braces and the carrier ring, so that asymmetrical inputs of current are eliminated. Nor need any kind of riveted joint be reamed out, so that the relatively expensive discoid component, in particular can quite frequently be used again. The surface of the focusing electrode can additionally be given a very smooth finish so that peak voltages with their detrimental effects can be similarly avoided. The extremely expensive adjustment in the known solution by differential skewing of the loose ends of the supporting braces is especially dispensed with. It must be borne in mind in this respect that such a possibility of adjustment after the first start-up is no longer available since the material customarily used for the supporting braces becomes exceedingly brittle when heated up.

Further advantageous refinements of the object of the invention will be apparent to one skilled in the arts.

One embodiment of the object of the invention and its essential parts are more particularly explained hereunder with the aid of FIGS. 1 through 4.

DETAILED DESCRIPTION OF THE PREFERRED EMBODIMENT

Figure 1:
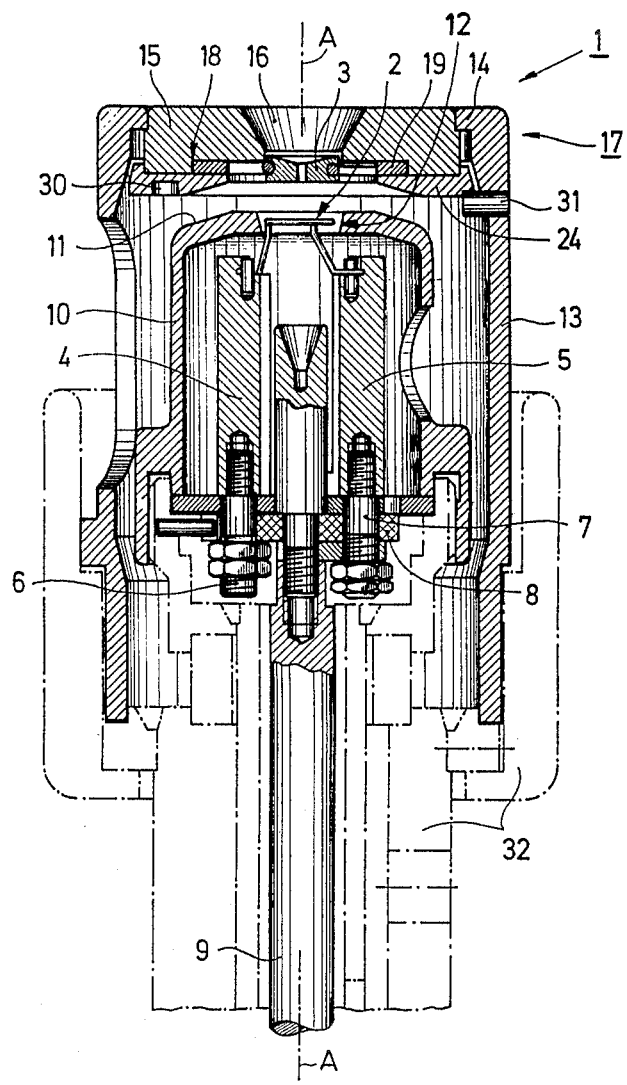
FIG. 1 shows an axial section through a complete electron gun.

FIG. 1 shows an electron gun 1 having a directly heatable first cathode 2 and a second cathode 3 indirectly heatable by the first cathode and known as the blocking cathode. The central portion of the first cathode 2 comprises a spirally curved component which, over two connecting ends leading towards the rear and at the outside, is connected with metallic support brackets 4 and 5, over which the power is supplied at the same time. Support brackets 4 and 5 are retained by means of two terminal pins 6 and 7 on an insulator body 8, which in its turn is fastened to a carrier rod 9 leading at the same time to the power supply for the right terminal pin 7. The power supply to terminal pin 6 is not shown in greater detail. The system described above is housed in an internal focusing electrode 10, which has a coaxial bore 12 on its front 11, the first cathode 2 being mounted concentrically in that bore. A beam of radiation directed upwards in operation (shown in FIG. 1) is thus generated and impinges on the blocking cathode 3, effecting a more or less intense heating-up of the blocking cathode 3 conditioned by the potential difference control, so that the cathode in its turn again emits an upwardly directed beam.

The internal focusing electrode 10 is concentrically surrounded by a hollow cylinder 13 having a front flange 14. Into the circular space so formed, a discoid component 15 is introduced in such a way, that its central bore 16 runs concentrically to the common center line A—A of the whole system. The discoid component 15 is supported on a locating face (not denoted in greater detail) on the frontal flange 14. The hollow cylinder 13 and the discoid component 15 form an external focusing electrode 17.

Figure 2:
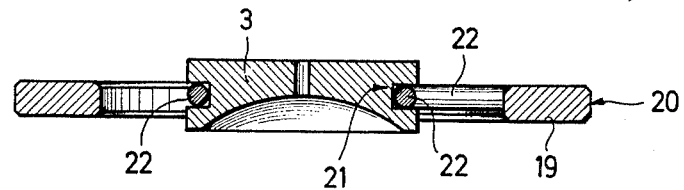
FIG. 2 shows an axial section on an enlarged scale of an assembly comprising a blocking cathode, supporting braces and carrier ring.
Figure 3:
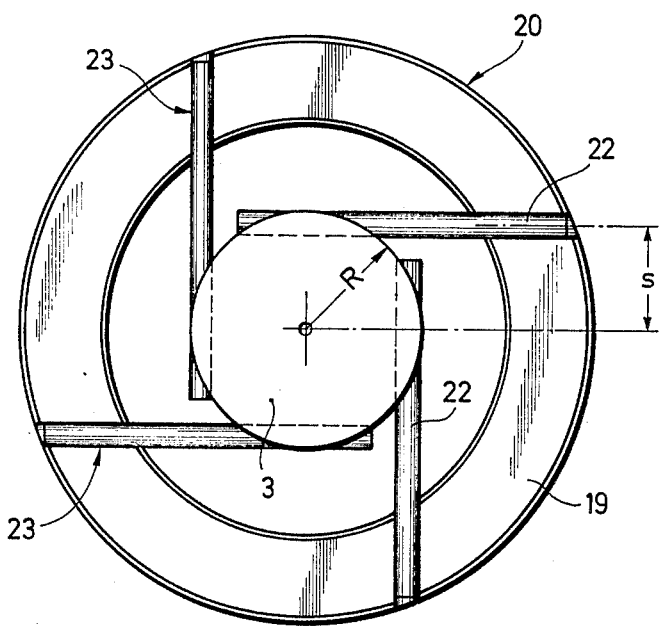
FIG. 3 shows a plain view on to the object of FIG. 1.

The discoid component 15 is in a first centering area 18 concentric with the bore 16 and designed as a narrow cylindrical zone. The cylindrical recess delimited by the centering region 18 serves to accommodate the assembly shown in FIGS. 2 and 3 to which the carrier ring 19 belongs. This carrier ring has a second centering region 20 which is similarly a narrow cylindrical zone and is complementary to the first centering region 18. Within the carrier ring 19 is the blocking cathode, provided with a peripheral groove 21 into which four supporting braces 22 are fitted in somewhat tangential alignment at equal distances distributed along the periphery. The supporting braces 22 are designed as cylinder bolts and have their inner ends forced into the peripheral groove 21. Each of the supporting braces 24 is forced respectively by its other end into a corresponding groove 23 in the carrier ring 19, where each of these grooves runs along a chord offset parallel to a diametrical line at a distance s. As can be seen especially from FIG. 3, the dimension is equivalent to the radius R of the blocking cathode 3 less half the diameter of the supporting brace 22. Obviously a sufficiently large clearance is available between the blocking cathode 3 and the internal diameter of carrier ring 19.

Figure 4:
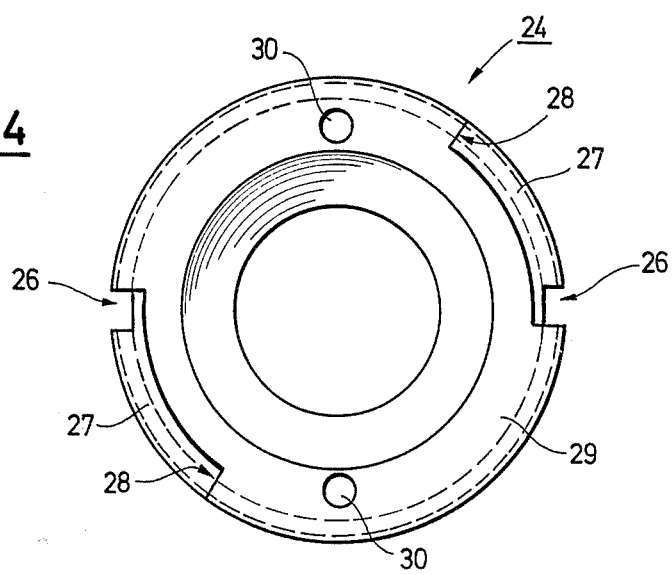
FIG. 4 shows a bottom view of the locking ring on a reduced scale as against FIGS. 2 and 3.

As can again be seen from FIG. 1, carrier ring 19 is retained in the discoid component 15 by a locking ring 24 whose details are explained with the help of FIG. 4. The internal diameter of locking ring 24 corresponds in this respect substantially with the internal diameter of carrier ring 19. Locking ring 24 has on its outer periphery 25 two radial grooves 26 extending across the whole thickness of the locking ring. From these grooves 26, two inclined planes 27 start their peripheral course, their terminal edges 28 lying in the lower area 29 of locking ring 24. Two drill holes 30 are also available for taking a tool for twisting the locking ring 24.

To fix the locking ring whose outside diameter is approximately equal to the inside diameter of the hollow cylinder 13, two dowel pins 31 occupy diametrically opposite places (corresponding to the position of the grooves 26) inside the hollow cylinder, only one of these pins being shown in the drawing. The grooves 26 permit the locking ring 24 to be brought in between the dowel pins 31 and the discoid component 15. Twisting the locking ring 24 clockwise (as shown in FIG. 4) causes the inclined planes 27 to slide across the dowel pins 31 towards the terminal edges 28 so that the locking ring 24 is gripped tight against the dowel pins 31 on one side and against the discoid component 15 on the other side. This causes part 15 to be pressed against the front flange 14 in its turn.

FIG. 1 shows that an extraordinarily accurate geometric alignment and/or adjustment of all of the parts to each other is facilitated by the construction according to the invention. Moreover, unusually simple replaceability of the parts in question is guaranteed.

In accordance with FIG. 1 the parts forming the electron gun 1 are fixed in a mounting 32 which is shown, however, only in dash-and-dot line.

We claim:

1. In an electron gun comprising (a) a directly heatable first cathode; (b) a second, blocking cathode, mounted in front of said first cathode and indirectly heated thereby; (c) a carrier ring having a coaxial centering surface; (d) a plurality of separated, supporting braces connecting said blocking cathode with said carrier ring; and (e) a removeable external Wehnelt electrode having a central opening for passing focused electrons, said blocking cathode being mounted coaxially relative to said central opening of said Wehnelt electrode, the improvement wherein said Wehnelt electrode and said carrier ring have mating centering surfaces; wherein said blocking cathode, said supporting braces and said carrier ring form a structural unit which may be inserted in said Wehnelt electrode from the side thereof facing said first cathode; thus requiring no assembly or fixture to any other part of the whole system and wherein said electron gun further comprises a removeable locking ring for clamping said carrier ring against said Wehnelt electrode with said centering surfaces in mating relationship, whereby said structural unit may be assembled separately with said blocking cathode fixed in position with respect to said carrier ring, and said carrier ring may thereafter be clamped into position on said wehnelt electrode with said blocking cathode in alignment with said central opening.

2. An electron gun as defined in claim 1, wherein said blocking cathode possesses at least one circumferential groove, said carrier ring possesses a plurality of openings, each having an axis extending along a respective chord of said ring, and wherein said supporting braces are cylindrical bolts, one end of each bolt being disposed in said circumferential groove and the other end being rigidly mounted in one of said openings.

3. An electron gun as defined in claim 1, wherein said locking ring possesses at least two radial grooves disposed on its outer periphery and a circumferentially extending inclined surface that terminates at each of said grooves, said locking ring being mountable in said electron gun by engagement of said inclined surfaces with respective abutments on said electron gun.

* * * * *